(12) United States Patent
Hwang

(10) Patent No.: US 11,527,597 B2
(45) Date of Patent: Dec. 13, 2022

(54) DISPLAY DEVICE HAVING CONDUCTIVE TAPE CONNECTING WINDOW OR DISPLAY PANEL TO METAL LAYER

(71) Applicant: Samsung Display Co., Ltd., Yongin-si (KR)

(72) Inventor: Jong-Kwang Hwang, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 177 days.

(21) Appl. No.: 17/015,002

(22) Filed: Sep. 8, 2020

(65) Prior Publication Data

US 2021/0074789 A1 Mar. 11, 2021

(30) Foreign Application Priority Data

Sep. 9, 2019 (KR) .......................... 10-2019-0111252

(51) Int. Cl.
*H01L 27/32* (2006.01)
*H01L 51/00* (2006.01)
*H01L 51/52* (2006.01)

(52) U.S. Cl.
CPC ...... *H01L 27/3272* (2013.01); *H01L 27/3276* (2013.01); *H01L 51/0097* (2013.01); *H01L 51/524* (2013.01); *H01L 2251/5338* (2013.01)

(58) Field of Classification Search
None
See application file for complete search history.

(56) References Cited

U.S. PATENT DOCUMENTS

| 7,948,743 B2 | 5/2011 | Kim et al. |
| 2015/0028316 A1* | 1/2015 | Kojima .................. H01L 51/56 257/40 |
| 2018/0006004 A1 | 1/2018 | Namkung et al. |
| 2018/0082929 A1 | 3/2018 | Lai et al. |

(Continued)

FOREIGN PATENT DOCUMENTS

| KR | 10-2007-0024919 | 3/2007 |
| KR | 10-2008-0055068 | 6/2008 |

(Continued)

OTHER PUBLICATIONS

Renard, R., "Avoiding ESD and EMI in mobile phones", Electronic Products Nov. 3, 2008, downloaded from URL< https://www.electronicproducts.com/avoiding-esd-and-emi-in-mobile-phones/> on Apr. 29, 2022. (Year: 2008).*

(Continued)

*Primary Examiner* — J. E. Schoenholtz
(74) *Attorney, Agent, or Firm* — H.C. Park & Associates, PLC

(57) ABSTRACT

A display device includes a display panel, a window, a metal layer, and a first conductive tape. The display panel includes a display area, a non-display area, and a bending area disposed between the display area and the non-display area and bent such that the non-display area overlaps the display area. The window is disposed on a first surface of the display panel and includes a protruding portion overlapping the non-display area. The metal layer is disposed on a second surface of the display panel. The second surface is opposite to the first surface. The first conductive tape connects the protruding portion of the window to the metal layer.

20 Claims, 16 Drawing Sheets

(56) References Cited

U.S. PATENT DOCUMENTS

| | | | | |
|---|---|---|---|---|
| 2018/0151644 A1* | 5/2018 | Han | ................... | H01L 27/3244 |
| 2018/0373913 A1* | 12/2018 | Panchawagh | ....... | G01S 7/52079 |
| 2019/0131364 A1 | 5/2019 | Hayk et al. | | |
| 2020/0227504 A1* | 7/2020 | Luo | ........................ | G06F 1/182 |

FOREIGN PATENT DOCUMENTS

| | | |
|---|---|---|
| KR | 10-2009-0086845 | 8/2009 |
| KR | 10-2010-0018428 | 2/2010 |
| KR | 10-2013-0063713 | 6/2013 |
| KR | 10-2014-0076790 | 6/2014 |
| KR | 10-2017-0120001 | 10/2017 |
| KR | 10-2018-0079554 | 7/2018 |

OTHER PUBLICATIONS

Technical Data Sheet of Copper Foil Tape, Zhuahi Hauayuan Electronics, down located from URL < https://www.sparkfun.com/products/13827> on Apr. 29, 2022. (Year: 2022).*

Extended European Search Report dated Mar. 10, 2021, in European Patent Application No. 20195184.5.

* cited by examiner

DISPLAY DEVICE HAVING CONDUCTIVE TAPE CONNECTING WINDOW OR DISPLAY PANEL TO METAL LAYER

CROSS-REFERENCE TO RELATED APPLICATION

This application claims priority to and the benefit of Korean Patent Application No. 10-2019-0111252, filed Sep. 9, 2019, which is hereby incorporated by reference for all purposes as if fully set forth herein.

BACKGROUND

Field

Various exemplary embodiments generally relate to a display device, and, more particularly, to a display device including a bendable display panel.

Discussion

Some display devices, such as flexible display devices, are capable of being bent, curved, flexed, folded, stretched, twisted, and/or the like. Such flexible display devices can be used in various fields since they can be used in various forms, such as a folded or curved form. Flexible display devices attract considerable attention as next-generation display technologies because their volume (or form factor) can be manipulated (e.g., reduced) for easy portability and their screens can be stretched for realizing a large-area display screen.

A flexible display device may include a substrate including flexible insulating materials, a window, etc., and static electricity may be accumulated in an insulating substrate, the window, etc., in a process of using the display device. Elements included in the display device may be damaged by electrostatic discharge due to the static electricity accumulated in the insulating substrate, the window, etc. Accordingly, quality of an image displayed by the display device may be degraded.

The above information disclosed in this section is only for understanding the background of the inventive concepts, and, therefore, may contain information that does not form prior art.

SUMMARY

Some aspects provide a display device capable of preventing damage due to electrostatic discharge.

Additional aspects will be set forth in the detailed description which follows, and, in part, will be apparent from the disclosure, or may be learned by practice of the inventive concepts.

According to some aspects, a display device includes a display panel, a window, a metal layer, and a first conductive tape. The display panel includes a display area, a non-display area, and a bending area disposed between the display area and the non-display area and bent such that the non-display area overlaps the display area. The window is disposed on a first surface of the display panel and includes a protruding portion overlapping the non-display area. The metal layer is disposed on a second surface of the display panel. The second surface is opposite to the first surface. The first conductive tape connects the protruding portion of the window to the metal layer.

According to some aspects, a display device includes a display panel, a window, a metal layer, and a first conductive tape. The display panel includes a display area, a non-display area, and a bending area disposed between the display area and the non-display area and bent such that the non-display area overlaps the display area. The window is disposed on a first surface of the display panel. The metal layer is disposed on a second surface of the display panel. The second surface is opposite to the first surface. The first conductive tape connects the non-display area of the display panel to the metal layer.

According to various exemplary embodiments, a display device may include a first conductive tape connecting a protruding portion of a window disposed on a first surface of a display panel to a metal layer disposed on a second surface of the display panel such that static electricity accumulated in the window can escape to the metal layer through the first conductive tape. Accordingly, damage to the display device due to electrostatic discharge from the window may be prevented.

According to various exemplary embodiments, a display device may include a first conductive tape connecting a non-display area of a display panel to a metal layer disposed on a second surface of the display panel such that static electricity accumulated in the display panel may escape to the metal layer through the first conductive tape. Accordingly, damage to the display device due to electrostatic discharge from the display panel may be prevented.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF SOME EXEMPLARY EMBODIMENTS

Figure 1:
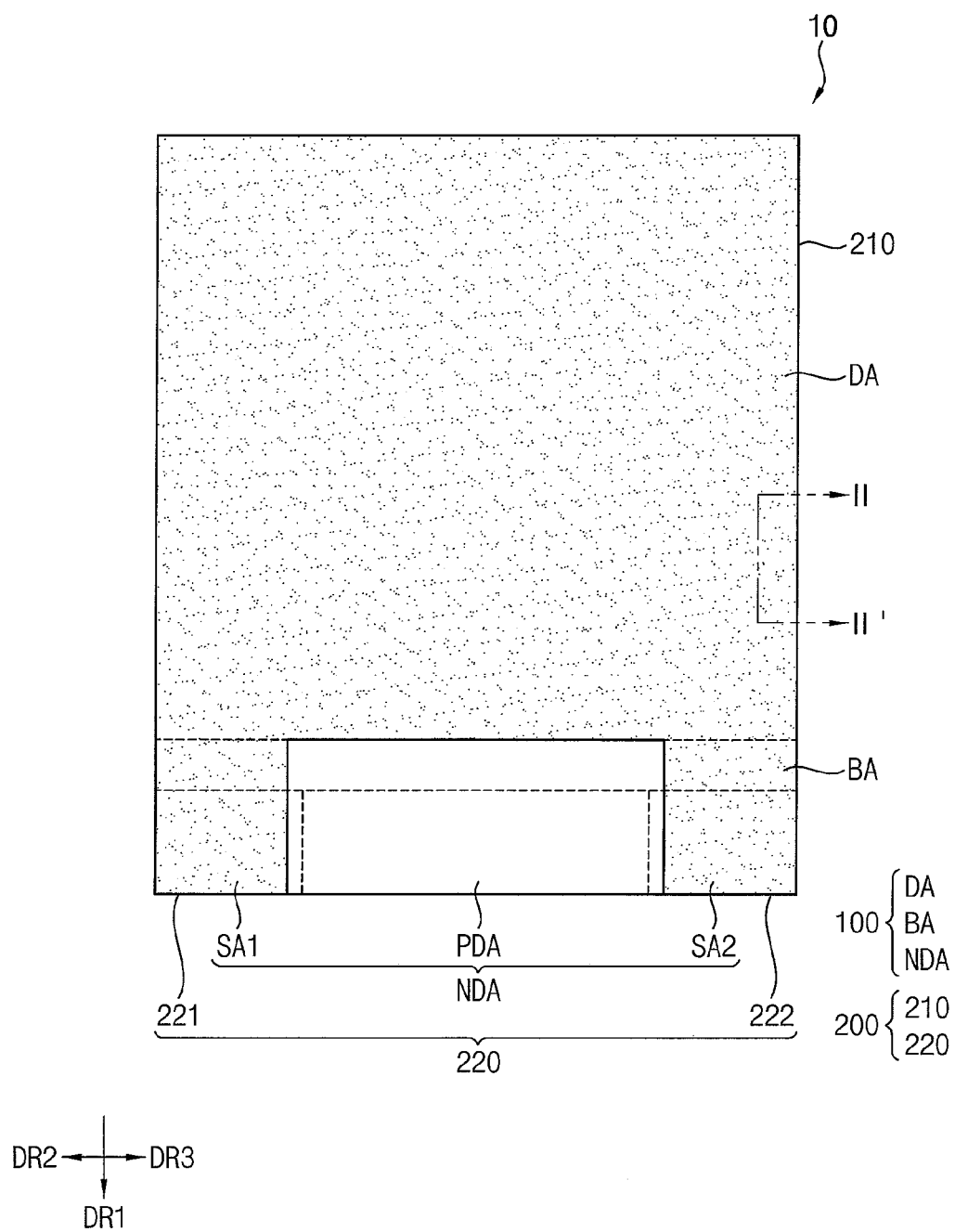
FIG. 1 is a front view illustrating a display device according to according to some exemplary embodiments.

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

A display device according to some embodiments will now be described with reference to FIGS. 1 to 7.

Figure 2:
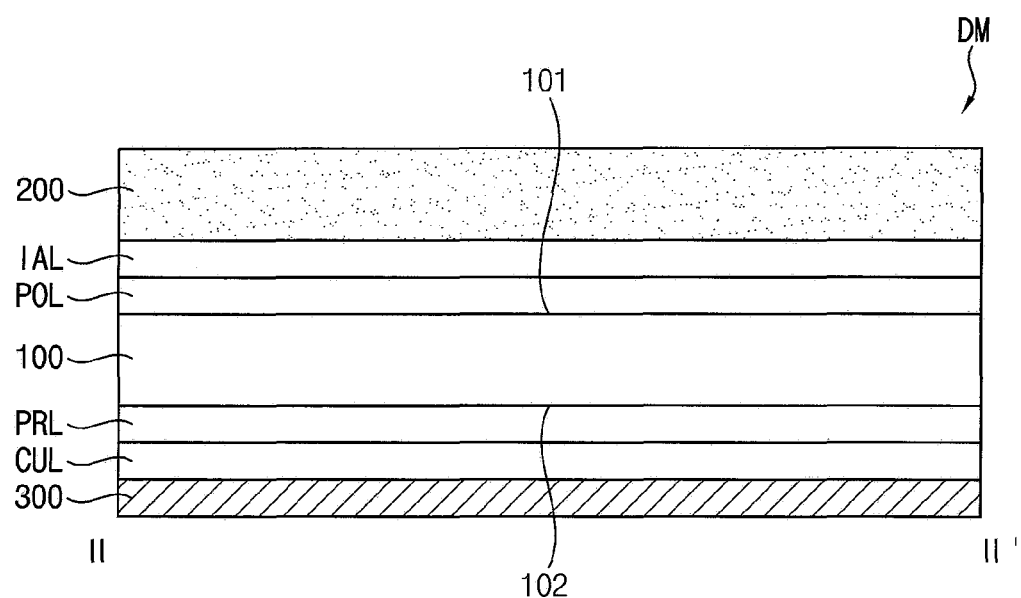
FIG. 2 is a cross-sectional view taken along sectional line II-II' in FIG. 1 according to some exemplary embodiments.

FIG. 1 is a front view illustrating a display device according to according to some exemplary embodiments. FIG. 2 is a cross-sectional view taken along sectional line II-II' in FIG. 1 according to some exemplary embodiments.

Referring to FIGS. 1 and 2, a display device 10 according to an embodiment may include a display module DM. The display module DM may include a display panel 100, a polarizing layer POL, an impact absorbing layer IAL, a window 200, a protective layer PRL, a cushion layer CUL, and a metal layer 300.

The display panel 100 may generate an image. The display panel 100 may provide the generated image toward a first surface 101. For example, the first surface 101 may be an upper surface of the display panel 100. The display panel 100 may include a plurality of pixels for generating the image. Light emitted from each of the pixels may be combined to generate the image. In addition, the display panel 100 may sense external input, such as an external object contacting or approaching the display panel 100.

The display panel 100 may include a display area DA, a non-display area NDA, and a bending area BA. The pixels may be disposed in the display area DA, so that the display area DA may display the image.

The non-display area NDA may be disposed at a side of the display area DA. For example, the non-display area NDA may be disposed in a first direction DR1 from the display area DA. The non-display area NDA may include a pad area PDA, and a first side area SA1 and a second side area SA2 respectively located at opposite sides of the pad area PDA. For example, the first side area SA1 and the second side area SA2 may be located in a second direction DR2 crossing the first direction DR1 and a third direction DR3 opposite to the second direction DR2 from the pad area PDA, respectively. Pads may be disposed in the pad area PDA so that the pad area PDA may transmit signals received from the outside to the display area DA.

The bending area BA may be disposed between the display area DA and the non-display area NDA. The bending area BA may be bent along a bending axis extending in the second direction DR2.

The polarizing layer POL may be disposed on the first surface 101 of the display panel 100. The polarizing layer POL may reduce reflection of external light of the display device 10. For example, when the external light having passed through the polarizing layer POL is reflected from below the polarizing layer POL (e.g., the display panel 100) and then passes through the polarizing layer POL again, a phase of the reflected external light may be changed as the incoming external light passes through the polarizing layer POL twice. As a result, a phase of reflected external light may be different from the phase of the incoming external light entering the polarizing layer POL to the extent that a destructive interference occurs. Accordingly, the reflection of external light may be reduced to increase visibility of the display device.

The impact absorbing layer IAL may be disposed on the polarizing layer POL. The impact absorbing layer IAL may absorb external impact to an upper portion of the display device 10. Accordingly, the impact absorbing layer IAL may protect the first surface 101 of the display panel 100 from external impact.

The window 200 may be disposed on the impact absorbing layer IAL. The window 200 may protect the display panel 100 from impurities, impact, etc., from the outside. The window 200 may be flexible and may have insulating characteristics. In an embodiment, the window 200 may include plastic. Accordingly, the window 200 may bend together with the display panel 100 when the display panel 100 is bent. In some embodiments, one or more functional layers, such as a reflection preventing layer, a hard-coating layer, a fingerprint preventing layer, and/or the like, may be disposed on the window 200.

The window 200 may include a main portion 210 and a protruding portion 220. The main portion 210 may overlap the display area DA of the display panel 100, and an image provided toward the first surface 101 from the display area DA may pass through the main portion 210.

The protruding portion 220 may overlap the non-display area NDA and the bending area BA of the display panel 100. For example, the protruding portion 220 may protrude in the first direction DR1 from the main portion 210. In an embodiment, the protruding portion 220 may include a first protruding portion 221 overlapping the first side area SA1 of the non-display area NDA and a second protruding portion 222 overlapping the second side area SA2 of the non-display area NDA. Accordingly, the first protruding portion 221 and the second protruding portion 222 may be spaced apart from each other with the pad area PDA of the display panel 100 in between in a plan view.

The protective layer PRL may be disposed on a second surface 102 of the display panel 100. The second surface 102 may be opposite to the first surface 101. For example, the second surface 102 may be a lower surface of the display panel 100. The protective layer PRL may absorb external impact to a lower portion of the display device 10. Accordingly, the protective layer PRL may protect the second surface 102 of the display panel 100 from external impact.

The cushion layer CUL may be disposed under the protective layer PRL. The cushion layer CUL may be disposed under the display panel 100, and may alleviate the impact on the display panel 100. The cushion layer CUL may include polymer, such as at least one of polypropylene (PP), polyethylene (PE), and the like. The cushion layer CUL may be formed as a foam or gel. In an embodiment, the cushion layer CUL may include a material having high elastic force, for example, rubber.

The metal layer 300 may be disposed under the cushion layer CUL. The metal layer 300 may be electrically connected to at least one of a flexible circuit board and a main circuit board to shield electromagnetic interference. Further, the metal layer 300 may diffuse heat generated from the display panel 100 since the metal layer 300 may have high thermal conductivity. Furthermore, the metal layer 300 may serve to prevent static electricity from accumulating in (or on) the window 200 and/or the display panel 100 as described below.

According to some exemplary embodiments, one or more adhesive layers may be interposed between the display panel 100 and the polarizing layer POL, between the polarizing layer POL and the impact absorbing layer IAL, between the impact absorbing layer IAL and the window 200, between the display panel 100 and the protective layer PRL, between the protective layer PRL and the cushion layer CUL, and/or between the cushion layer CUL and the metal layer 300. For example, the adhesive layers may include at least one of pressure sensitive adhesive (PSA), optically clear adhesive (OCA), and the like.

Figure 3:
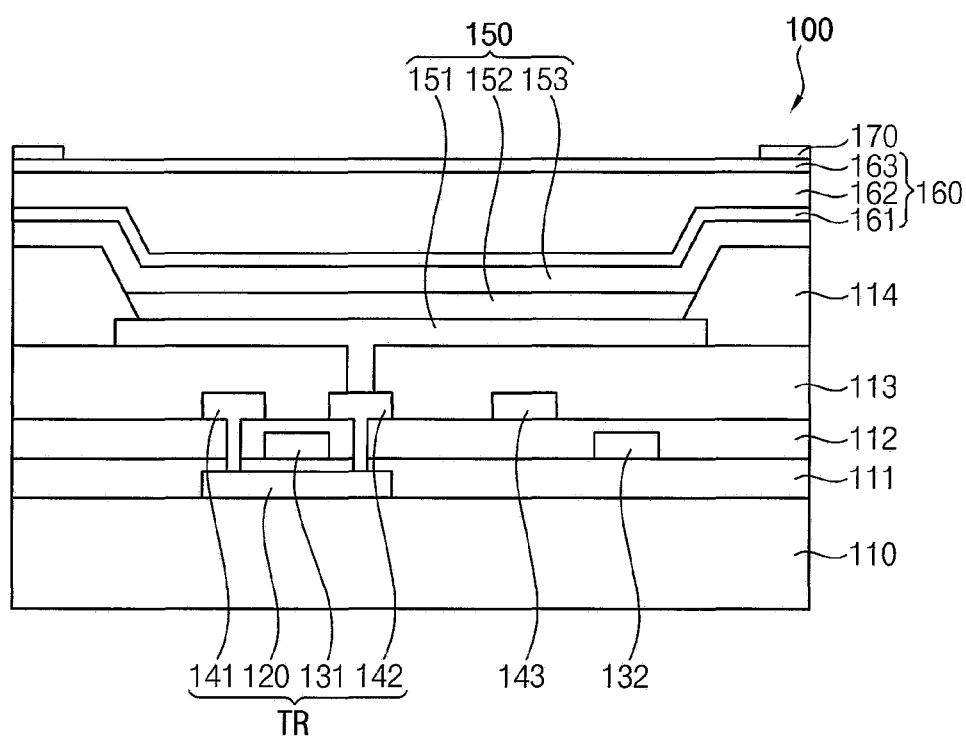
FIG. 3 is a cross-sectional view illustrating a display panel in FIG. 2 according to some exemplary embodiments.

FIG. 3 is a cross-sectional view illustrating a display panel in FIG. 2 according to some exemplary embodiments.

Referring to FIG. 3, the display panel 100 may include a substrate 110, a transistor TR, a light emitting element 150, an encapsulation layer 160, and a sensing layer 170.

The substrate 110 may be a flexible and insulating substrate. In an embodiment, the substrate 110 may include plastic.

An active layer 120 may be disposed on the substrate 110. The active layer 120 may include a source region, a drain region, and a channel region disposed between the source region and the drain region. The active layer 120 may be formed of amorphous silicon, polysilicon, an oxide semiconductor, and/or the like.

A first insulation layer 111 may be disposed on the active layer 120. The first insulation layer 111 may include an inorganic insulation material, such as at least one of silicon nitride, silicon oxide, and the like.

A gate electrode 131 and a gate line 132 may be disposed on the first insulation layer 111. The gate electrode 131 may overlap the channel region of the active layer 120. The gate line 132 may transmit a gate signal. The gate electrode 131 and the gate line 132 may include metal, such as at least one of molybdenum (Mo), copper (Cu), and the like.

A second insulation layer 112 may be disposed on the gate electrode 131 and the gate line 132. The second insulation layer 112 may include an inorganic insulation material, such as at least one of silicon nitride, silicon oxide, and the like.

A source electrode 141, a drain electrode 142, and a data line 143 may be disposed on the second insulation layer 112. The source electrode 141 and the drain electrode 142 may be connected to the source region and the drain region of the active layer 120, respectively. The data line 143 may transmit a data signal. The source electrode 141, the drain electrode 142, and the data line 143 may include metal, such as at least one of aluminum (Al), titanium (Ti), copper (Cu), and the like. The active layer 120, the gate electrode 131, the source electrode 141, and the drain electrode 142 may form the transistor TR.

A third insulation layer 113 may be disposed on the source electrode 141, the drain electrode 142, and the data line 143. The third insulation layer 113 may include an organic insulation material, such as at least one of polyimide and/or the like, and/or an inorganic insulation material, such as at least one of silicon nitride, silicon oxide, and the like.

A pixel electrode 151 may be disposed on the third insulation layer 113. The pixel electrode 151 may be connected to the source electrode 141 or the drain electrode 142. The pixel electrode 151 may include metal, such as at least one of magnesium (Mg), silver (Ag), gold (Au), calcium (Ca), lithium (Li), chromium (Cr), aluminum (Al), and the like, and/or a transparent conductive oxide, such as at least one of indium tin oxide (ITO), indium zinc oxide (IZO), zinc oxide (ZnO), and the like.

A fourth insulation layer 114 may be disposed on the pixel electrode 151. The fourth insulation layer 114 may cover a peripheral region of the pixel electrode 151, and may include a pixel opening exposing a center region of the pixel electrode 151. The fourth insulation layer 114 may include an organic insulation material, such as polyimide or the like.

An emission layer 152 may be disposed on the pixel electrode 151. The emission layer 152 may be disposed in the pixel opening of the fourth insulation layer 114. The emission layer 152 may include an organic light emitting material, but exemplary embodiments are not limited thereto.

In an embodiment, the organic light emitting material may include a low molecular organic compound or a high molecular organic compound. The low molecular organic compound may include at least one of copper phthalocyanine, N,N'-diphenylbenzidine, tris-(8-hydroxyquinoline)aluminum, and the like, and the high molecular organic compound may include at least one of poly(3,4-ethylenedioxythiophene), polyaniline, poly(p-phenylene vinylene), polyfluorene, and the like.

An opposite electrode 153 may be disposed on the emission layer 152. The opposite electrode 153 may also be disposed on the fourth insulation layer 114. The opposite electrode 153 may include metal, such as at least one of magnesium (Mg), silver (Ag), gold (Au), calcium (Ca), lithium (Li), chromium (Cr), aluminum (Al), and the like, and/or a transparent conductive oxide, such as at least one of indium tin oxide (ITO), indium zinc oxide (IZO), zincoxide (ZnO), and the like. The pixel electrode 151, the emission layer 152, and the opposite electrode 153 may form the light emitting element 150.

The encapsulation layer 160 may be disposed on the opposite electrode 153. The encapsulation layer 160 may include at least one inorganic encapsulation layer and at least one organic encapsulation layer. In an embodiment, the encapsulation layer 160 may include a first inorganic encapsulation layer 161 disposed on the opposite electrode 153, an organic encapsulation layer 162 disposed on the first inorganic encapsulation layer 161, and a second inorganic encapsulation layer 163 disposed on the organic encapsulation layer 162. The inorganic encapsulation layer may include at least one of silicon nitride, silicon oxynitride, and the like, and the organic encapsulation layer may include at least one of epoxy-based resin, acrylic resin, polyimide-based resin, and the like.

The sensing layer 170 may be disposed on the encapsulation layer 160. The sensing layer 170 may sense an external input, such as an external object contacting or approaching the sensing layer 170. For example, the sensing layer 170 may sense the external input with a static capacitive method. The sensing layer 170 may include low resistance metal, such as at least one of silver (Ag), aluminum (Al), copper (Cu), chromium (Cr), nickel (Ni), and the like, and/or a conductive nano material, such as at least one of silver nanowire, carbon nanotube, and the like.

In an embodiment, the sensing layer 170 may include a sensing electrode outputting a sensing signal corresponding to an external input to a sensing driver and a driving electrode receiving a driving signal from the sensing driver. For example, a portion of the sensing layer 170 may be the sensing electrode, and another portion of the sensing layer 170 may be the driving electrode.

Figure 4:
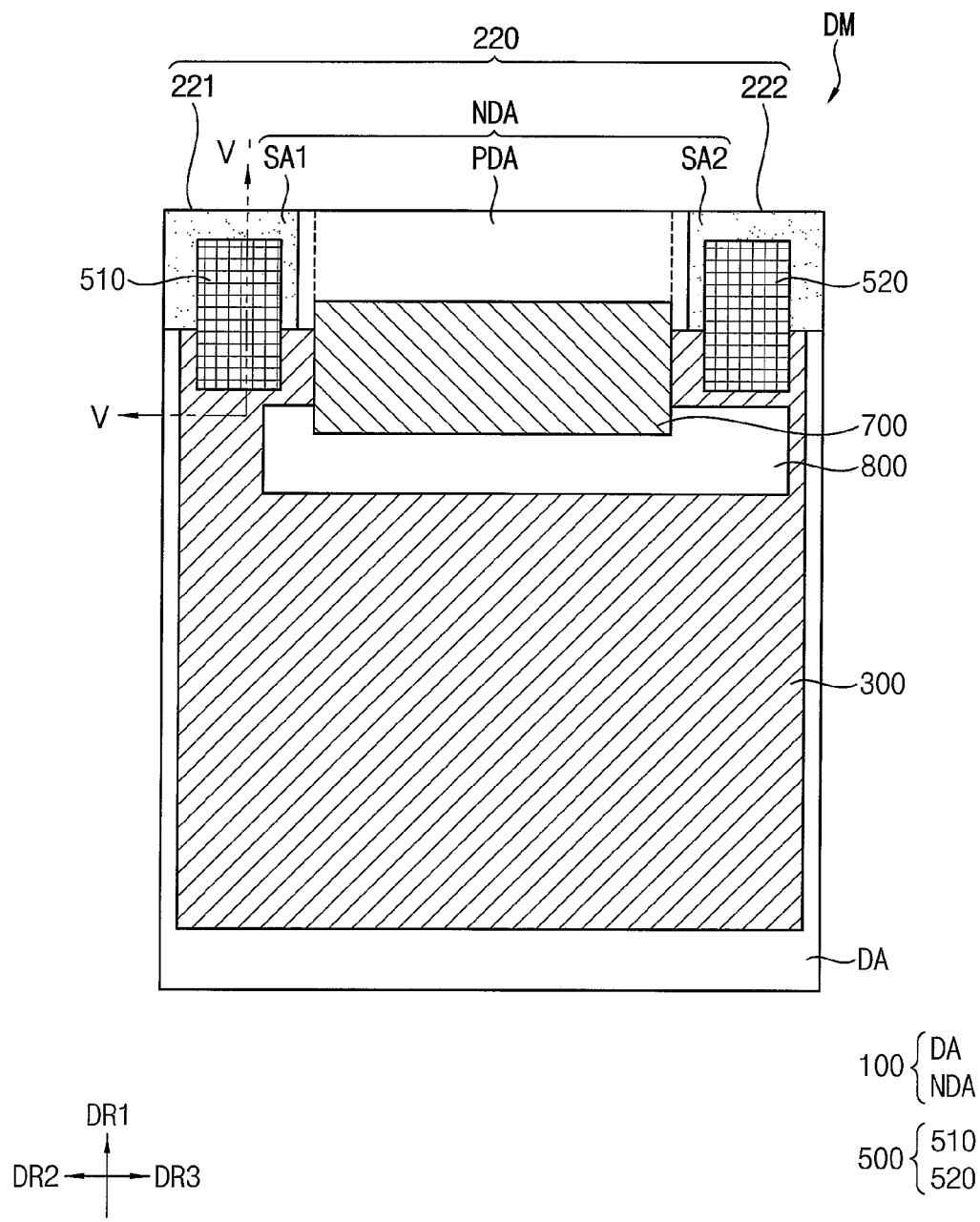
FIG. 4 is a rear view illustrating an example in which the display device in FIG. 1 is bent according to some exemplary embodiments.
Figure 5:
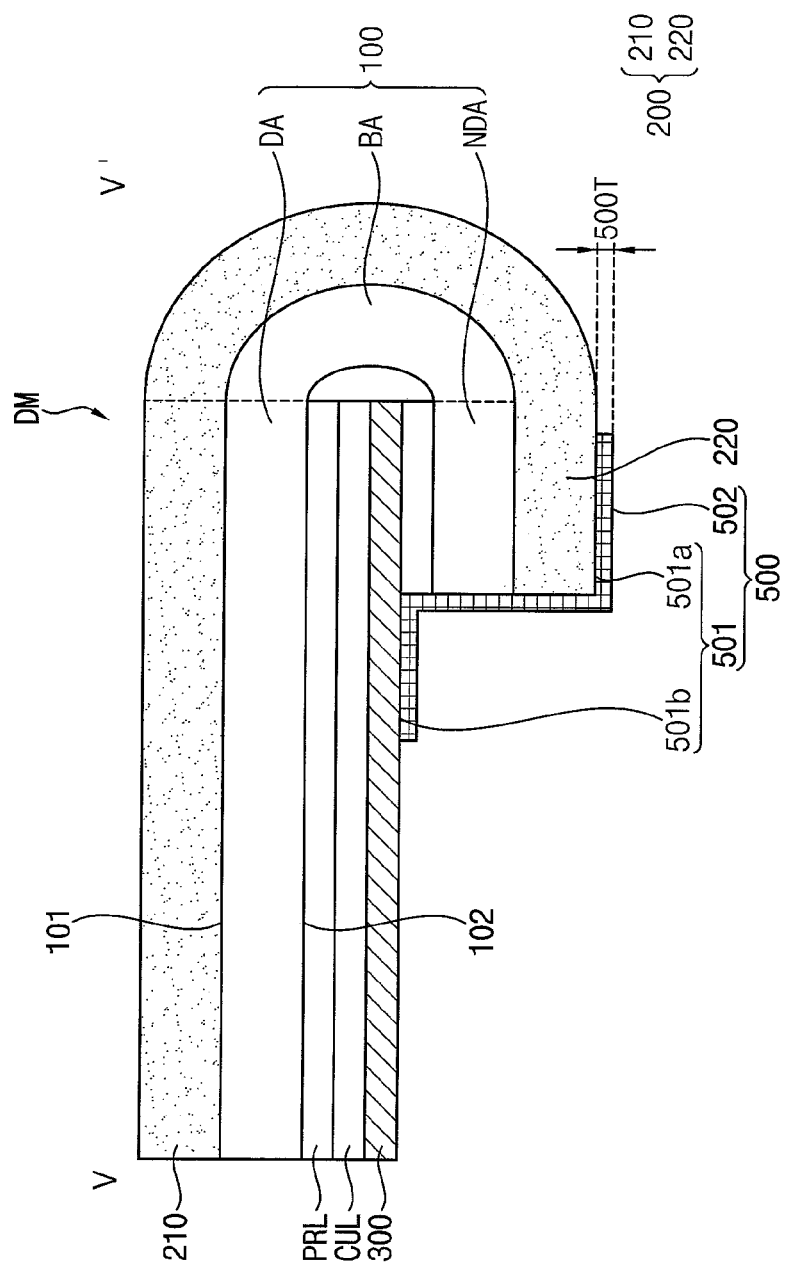
FIG. 5 is a cross-sectional view taken along sectional line V-V' in FIG. 4 according to some exemplary embodiments.

FIG. 4 is a rear view illustrating an example in which the display device in FIG. 1 is bent according to some exemplary embodiments. FIG. 5 is a cross-sectional view taken along sectional line V-V' in FIG. 4 according to some exemplary embodiments. Hereinafter, the polarizing layer POL and the impact absorbing layer IAL are not illustrated in the drawings for convenience of description.

Referring to FIGS. 4 and 5, the bending area BA of the display panel 100 may be bent along a bending axis extending in the second direction DR2. The bending area BA may be bent such that portions of the second surface 102 of the display panel 100 face to each other and the non-display area NDA overlaps the display area DA.

The flexible circuit board 700 may be connected to the pad area PDA of the non-display area NDA of the display panel 100, and the main circuit board 800 may be connected to the flexible circuit board 700. A side of the flexible circuit board 700 may be connected to pads disposed in the pad area PDA of the display panel 100, and another side of the flexible circuit board 700 may be connected to the main circuit board 800.

The protruding portion 220 of the window 200 may be bent along the bending area BA of the display panel 100. The first protruding portion 221 may be bent along a portion of the bending area BA adjacent to the first side area SA1, and the second protruding portion 222 may be bent along a portion of the bending area BA adjacent to the second side area SA2.

The display device 10 may include a first conductive tape 500 connecting the protruding portion 220 of the window 200 to the metal layer 300. The first conductive tape 500 may be formed as a thin film, and may include metal, such as copper (Cu) and/or the like.

The first conductive tape 500 may include a first surface 501 and a second surface 502 opposite to the first surface 501. The first surface 501 may be adhesive, and the second surface 502 may not be adhesive. A first portion 501a of the first surface 501 may be attached to the protruding portion 220 of the window 200, and a second portion 501b of the first surface 501 may be attached to the metal layer 300. The first surface 501 of the first conductive tape 500 may be attached to the protruding portion 220 of the window 200 and the metal layer 300, and the first conductive tape 500 may connect the window 200 to the metal layer 300 so that the first conductive tape 500 may have a relatively small thickness 500T.

In a process of using the display device 10, friction may occur between the display device 10 and a user or an external object, and in some instances, when the window 200 includes an insulation material, such as plastic, static electricity may flow into the window 200 from the user or the external object. When electrostatic discharge (ESD) occurs in the window 200 in which static electricity is accumulated, elements included in the display device 10 may be damaged. However, the display device 10 according to some embodiments may include the first conductive tape 500 connecting the protruding portion 220 of the window 200 disposed on the first surface 101 of the display panel 100 to the metal layer 300 disposed on the second surface 102 of the display panel 100 so that the static electricity accumulated in the window 200 may escape to the metal layer 300 through the first conductive tape 500, and, therefore, damage to the display device 10 due to electrostatic discharge from the window 200 may be prevented.

The first conductive tape 500 may include a first portion 510 connecting the first protruding portion 221 of the window 200 to the metal layer 300 and a second portion 520 connecting the second protruding portion 222 of the window 200 to the metal layer 300. In an embodiment, the first portion 510 and the second portion 520 of the first conductive tape 500 may be respectively overlap the first protruding portion 221 and a portion of the metal layer 300 adjacent thereto and the second protruding portion 222 and another portion of the metal layer 300 adjacent thereto with the pad area PDA in between in a plan view.

When static electricity flows into the window 200, the static electricity may mainly accumulate at an edge or a corner of the window 200, and in some embodiments, the static electricity may accumulate at the first protruding portion 221 and the second protruding portion 222. Therefore, the first portion 510 of the first conductive tape 500 may connect the first protruding portion 221 to the metal layer 300, and the second portion 520 of the first conductive tape 500 may connect the second protruding portion 222 to the metal layer 300 so that the static electricity may efficiently escape to the metal layer 300 from the window 200.

Figure 6:
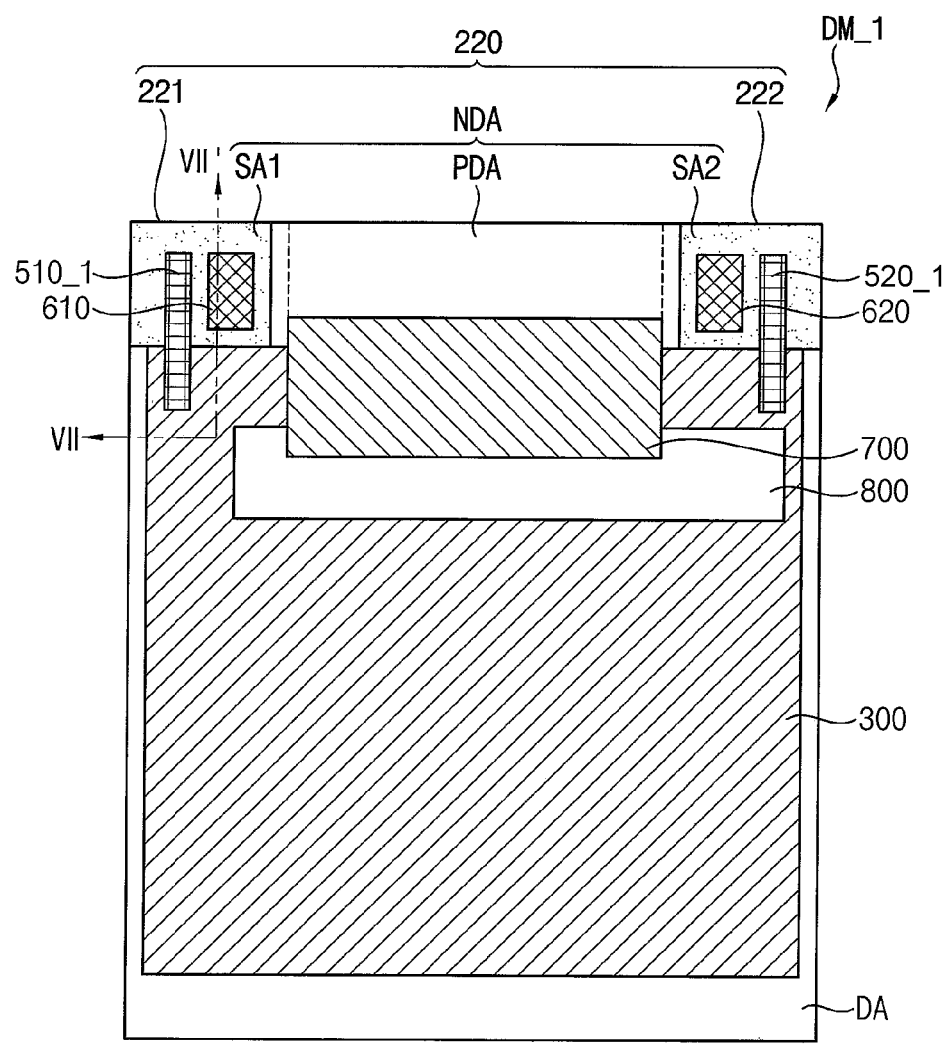
FIG. 6 is a rear view illustrating another example in which the display device in FIG. 1 is bent according to some exemplary embodiments.
Figure 7:
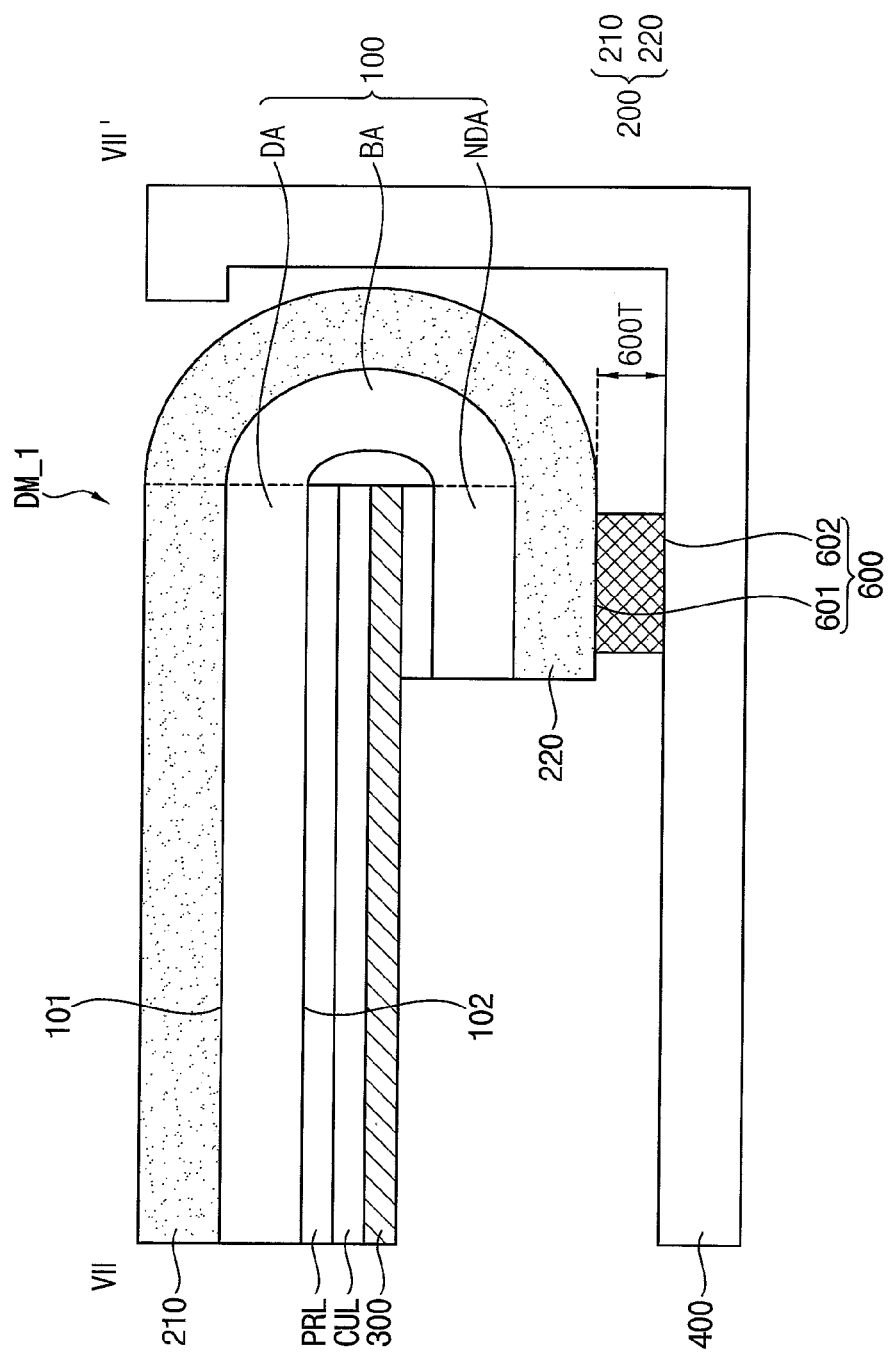
FIG. 7 is a cross-sectional view taken along sectional line VII-VII' in FIG. 6 according to some exemplary embodiments.

FIG. 6 is a rear view illustrating another example in which the display device in FIG. 1 is bent according to some exemplary embodiments. FIG. 7 is a cross-sectional view taken along sectional line VII-VII' in FIG. 6 according to some exemplary embodiments. Descriptions of elements of the display device 10 described with reference to FIGS. 6 and 7, which are substantially the same as or similar to those of the display device 10 described with reference to FIGS. 4 and 5, will not be repeated.

Referring to FIGS. 6 and 7, the display device 10 may include a bracket 400 disposed under the display panel 100. The bracket 400 may accommodate the display module DM_1. The bracket 400 may include a lower surface and a sidewall connected to an edge of the lower surface. The lower surface of the bracket 400 may face a lower surface of the display module DM_1, and the sidewall of the bracket 400 may face a side surface of the display module DM_1. The lower surface of the bracket 400 may be spaced apart from the protruding portion 220 of the window 200 in (or at) a predetermined distance. The bracket 400 may be electrically conductive. In an embodiment, the bracket 400 may include metal, an alloy thereof, or the like.

The display device 10 may include a first conductive tape 500_1 connecting the protruding portion 220 of the window 200 to the metal layer 300 and a second conductive tape 600 connecting the protruding portion 220 of the window 200 to the bracket 400. The first conductive tape 500_1 and the second conductive tape 600 may be formed as a thin film, and may include metal, such as copper (Cu) or the like.

The second conductive tape 600 may include a first surface 601 and a second surface 602 opposite to the first surface 601. The first surface 601 and the second surface 602 may be adhesive. The first surface 601 may be attached to the protruding portion 220 of the window 200, and the second surface 602 may be attached to the bracket 400. The first surface 601 of the second conductive tape 600 may be attached to the protruding portion 220 of the window 200 and the second surface 602 of the second conductive tape 600 may be attached to the bracket 400, which is spaced apart from the protruding portion 220 of the window 200 in the predetermined distance, so that the second conductive tape 600 may connect the window 200 to the bracket 400. Accordingly, the second conductive tape 600 may have a relatively large thickness 600T. In an embodiment, the relatively large thickness 600T of the second conductive tape 600 may be greater than the relatively small thickness 500T of the first conductive tape 500.

The display device 10 according to some exemplary embodiments may include the first conductive tape 500_1 connecting the protruding portion 220 of the window 200 disposed on the first surface 101 of the display panel 100 to the metal layer 300 disposed on the second surface 102 of the display panel 100 and the second conductive tape 600 connecting the protruding portion 220 of the window 200 to the bracket 400 disposed under the display panel 100 so that the static electricity accumulated in the window 200 may escape to the metal layer 300 and the bracket 400 through the first conductive tape 500_1 and the second conductive tape 600, respectively. Therefore, damage to the display device 10 due to electrostatic discharge from the window 200 may further be prevented.

The second conductive tape 600 may include a first portion 610 connecting the first protruding portion 221 of the window 200 to the bracket 400 and a second portion 620 connecting the second protruding portion 222 of the window 200 to the bracket 400. In an embodiment, the first portion 610 and the second portion 620 of the second conductive tape 600 may be respectively overlap the first protruding portion 221 and the second protruding portion 222 with the pad area PDA in between in a plan view, and the first portion 510_1 and the second portion 520_1 of the first conductive tape 500_1 may respectively overlap the first protruding portion 221 and a portion of the metal layer 300 adjacent thereto and the second protruding portion 222 and another portion of the metal layer 300 adjacent thereto with the pad area PDA and each of the first portion 610 and the second portion 620 of the second conductive tape 600 in between in a plan view.

When static electricity flows into the window 200, the static electricity may mainly accumulate at an edge or a corner of the window 200, and in some embodiments, the static electricity may accumulate at the first protruding portion 221 and the second protruding portion 222. Therefore, the first portion 510_1 of the first conductive tape 500_1 may connect the first protruding portion 221 to the metal layer 300, the second portion 520_1 of the first conductive tape 500_1 may connect the second protruding portion 222 to the metal layer 300, the first portion 610 of the second conductive tape 600 may connect the first protruding portion 221 to the bracket 400, and the second portion 620 of the second conductive tape 600 may connect the second protruding portion 222 to the bracket 400 so that the static electricity may efficiently escape to the metal layer 300 and the bracket 400 from the window 200.

Hereinafter, a display device according to some embodiments will be described with reference to FIGS. 8 to 12. Descriptions of elements of the display device described with reference to FIGS. 8 to 12 that are substantially the same as or similar to those of the display device described with reference to FIGS. 1 to 7, will not be repeated.

Figure 8:
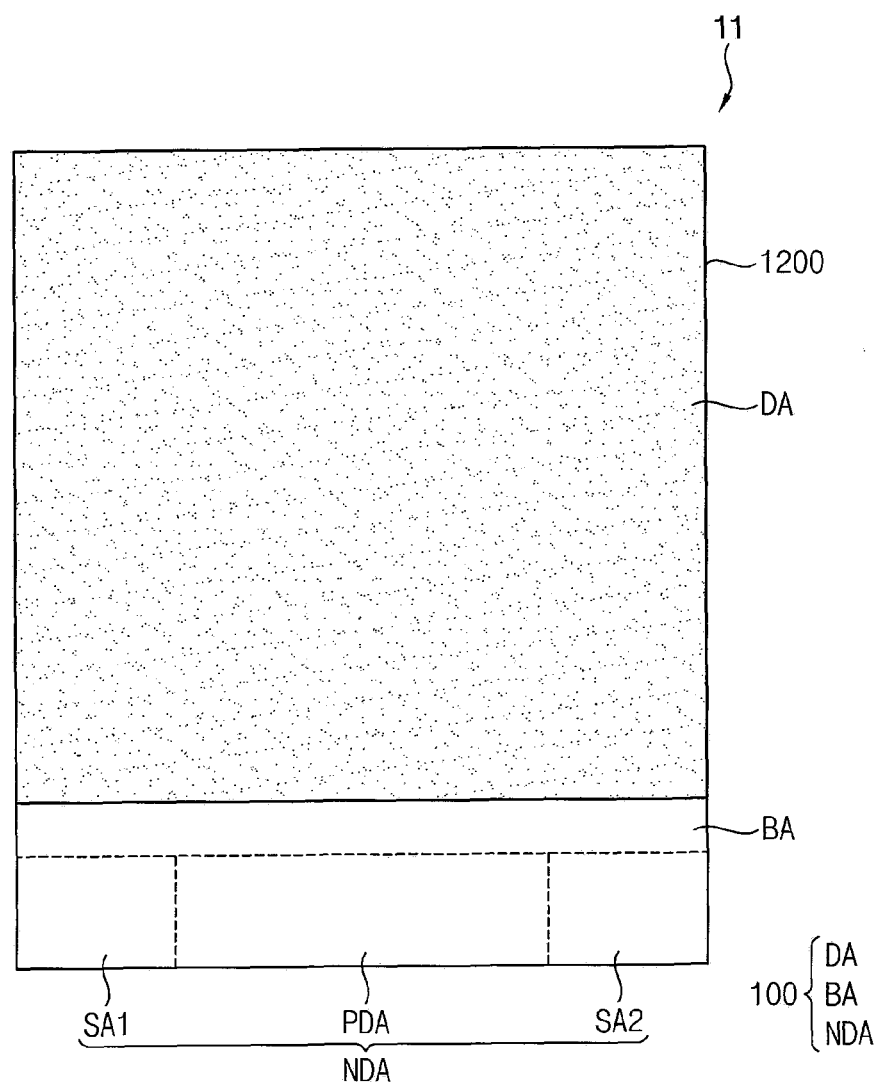
FIG. 8 is a front view illustrating a display device according to some exemplary embodiments.

FIG. 8 is a front view illustrating a display device according to some exemplary embodiments.

Referring to FIG. 8, a display device 11 according to an embodiment may include a display module DM_2 similar to the display module DM described in association with FIG. 2. The display module DM_2 may include a display panel 100, a polarizing layer POL in FIG. 2, an impact absorbing layer IAL in FIG. 2, a window 1200, a protective layer PRL in FIG. 2, a cushion layer CUL in FIG. 2, and a metal layer 300 in FIG. 2.

The window 1200 may be disposed on the first surface 101 of the display panel 100. The window 1200 may overlap the display area DA of the display panel 100, and an image provided toward the first surface 101 from the display area DA may pass through the window 1200. The window 1200 may not overlap the non-display area NDA and the bending area BA of the display panel 100.

Figure 9:
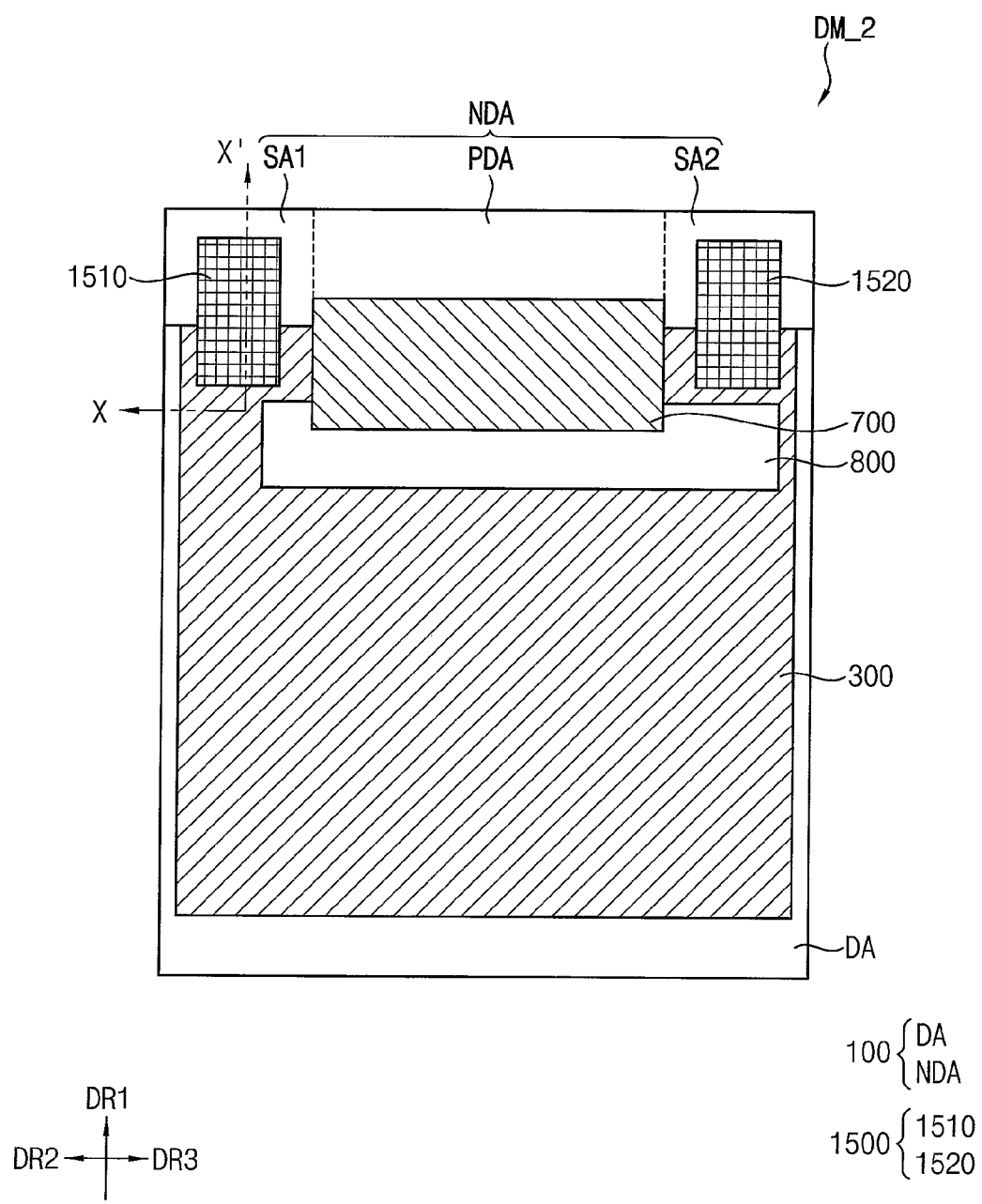
FIG. 9 is a rear view illustrating an example in which the display device in FIG. 8 is bent according to some exemplary embodiments.
Figure 10:
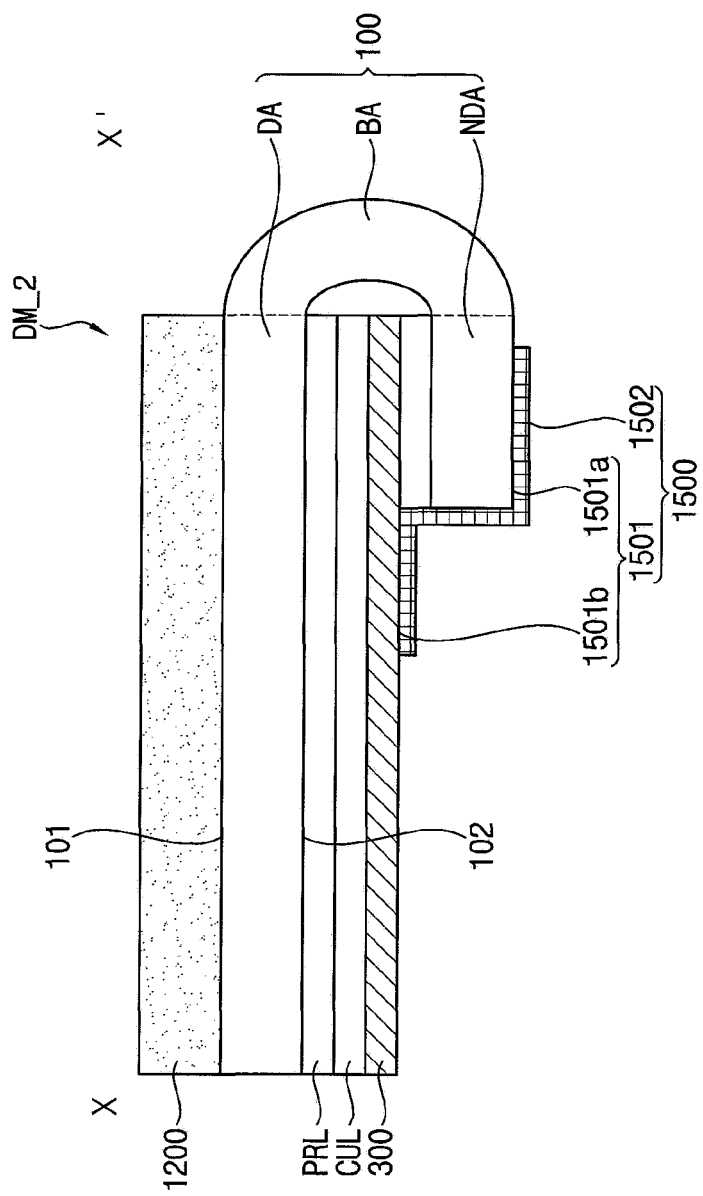
FIG. 10 is a cross-sectional view taken along sectional line X-X' in FIG. 9 according to some exemplary embodiments.

FIG. 9 is a rear view illustrating an example in which the display device in FIG. 8 is bent according to some exemplary embodiments. FIG. 10 is a cross-sectional view taken along sectional line X-X' in FIG. 9 according to some exemplary embodiments.

Referring to FIGS. 9 and 10, the bending area BA of the display panel 100 may be bent along a bending axis extending in the second direction DR2. The bending area BA may be bent such that portions of the second surface 102 of the display panel 100 face to each other and the non-display area NDA overlaps the display area DA.

The display device 11 may include a first conductive tape 1500 connecting the non-display area NDA of the display panel 100 to the metal layer 300. The first conductive tape 1500 may be formed as a thin film, and may include metal, such as copper (Cu) or the like.

The first conductive tape 1500 may include a first surface 1501 and a second surface 1502 opposite to the first surface 1501. The first surface 1501 may be adhesive, and the second surface 1502 may not be adhesive. A first portion 1501a of the first surface 1501 may be attached to the non-display area NDA of the display panel 100, and a second portion 1501b of the first surface 1501 may be attached to the metal layer 300. The first surface 1501 of the first conductive tape 1500 may be attached to the non-display area NDA of the display panel 100 and the metal layer 300, and the first conductive tape 1500 may connect the display panel 100 to the metal layer 300 so that the first conductive tape 1500 may have a relatively small thickness.

In a process of using the display device 11, friction may occur between the display device 11 and a user or an external object, and in some instances, when the display panel 100 includes a substrate formed of an insulation material such as plastic, static electricity may flow into the display panel 100 from the user or the external object. When electrostatic discharge (ESD) occurs in the display panel 100 in which static electricity is accumulated, elements included in the display device 11 may be damaged. However, the display device 11 according to some exemplary embodiments may include the first conductive tape 1500 connecting the non-display area NDA of the display panel 100 to the metal layer 300 disposed on the second surface 102 of the display panel 100 so that the static electricity accumulated in the display panel 100 may escape to the metal layer 300 through the first conductive tape 1500, and, therefore, damage to the display device 11 due to electrostatic discharge from the display panel 100 may be prevented.

The first conductive tape 1500 may include a first portion 1510 connecting the first side area SA1 of the non-display area NDA of the display panel 100 to the metal layer 300 and a second portion 1520 connecting the second side area SA2 of the non-display area NDA of the display panel 100 to the metal layer 300. In an embodiment, the first portion 1510 and the second portion 1520 of the first conductive tape 1500 may respectively overlap the first side area SA1 and a portion of the metal layer 300 adjacent thereto and the second side area SA2 and another portion of the metal layer 300 adjacent thereto with the pad area PDA in between in a plan view.

When static electricity flows into the display panel 100, the static electricity may mainly accumulate at an edge or a corner of the display panel 100, and in some instances, the static electricity may accumulate at the first side area SA1 and the second side area SA2 of the non-display area NDA of the display panel 100. Therefore, the first portion 1510 of the first conductive tape 1500 may connect the first side area SA1 to the metal layer 300, and the second portion 1520 of the first conductive tape 1500 may connect the second side area SA2 to the metal layer 300 so that the static electricity may efficiently escape to the metal layer 300 from the display panel 100.

Figure 11:
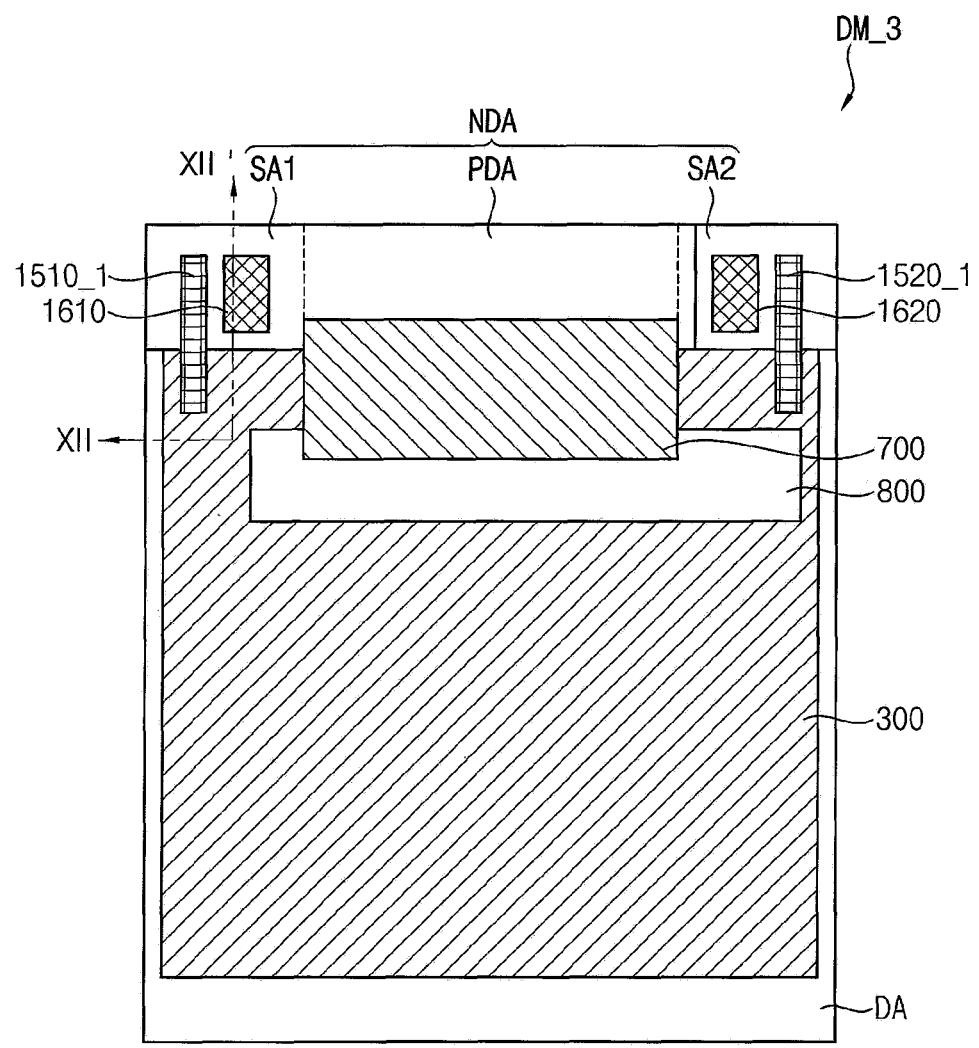
FIG. 11 is a rear view illustrating another example in which the display device in FIG. 8 is bent according to some exemplary embodiments.
Figure 12:
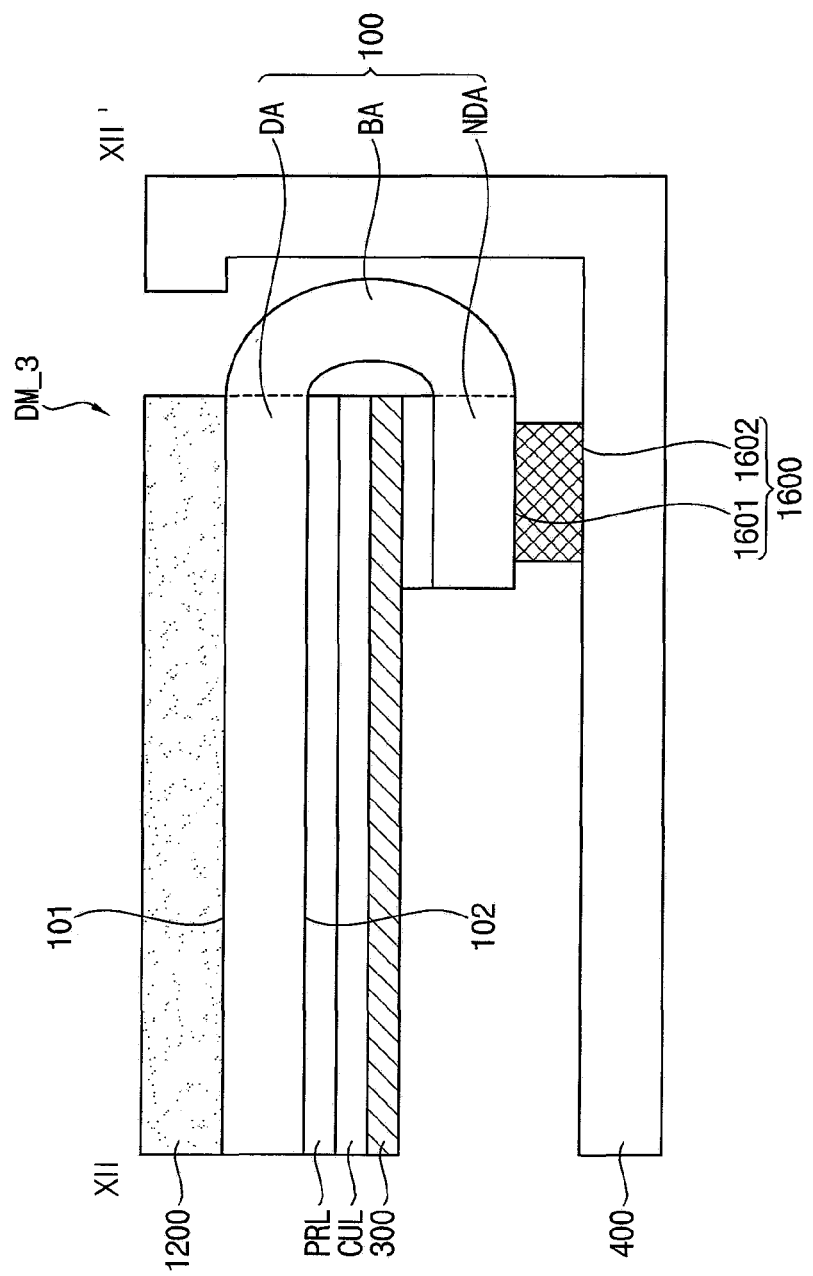
FIG. 12 is a cross-sectional view taken along sectional line XII-XII' in FIG. 11 according to some exemplary embodiments.

FIG. 11 is a rear view illustrating another example in which the display device in FIG. 8 is bent according to some exemplary embodiments. FIG. 12 is a cross-sectional view taken along sectional line XII-XII' in FIG. 11 according to some exemplary embodiments. Descriptions of elements of the display device 11 described with reference to FIGS. 11 and 12, which are substantially the same as or similar to those of the display device 11 described with reference to FIGS. 9 and 10, will not be repeated.

Referring to FIGS. 11 and 12, the display device 11 may include a bracket 400 disposed under the display panel 100 of the display module DM_3. The lower surface of the bracket 400 may be spaced apart from the non-display area NDA of the display panel 100 in (or at) a predetermined distance. The bracket 400 may be electrically conductive.

The display device 11 may include a first conductive tape 1500_1 connecting the non-display area NDA of the display panel 100 to the metal layer 300 and a second conductive tape 1600 connecting the non-display area NDA of the display panel 100 to the bracket 400. The first conductive tape 1500_1 and the second conductive tape 1600 may be formed as a thin film, and may include metal, such as copper (Cu) or the like.

The second conductive tape 1600 may include a first surface 1601 and a second surface 1602 opposite to the first surface 1601. The first surface 1601 and the second surface 1602 may be adhesive. The first surface 1601 may be attached to the non-display area NDA of the display panel 100, and the second surface 1602 may be attached to the bracket 400. The first surface 1601 of the second conductive tape 1600 may be attached to the non-display area NDA of the display panel 100 and the second surface 1602 of the second conductive tape 1600 may be attached to the bracket 400 that is spaced apart from the non-display area NDA of the display panel 100 in the predetermined distance so that the second conductive tape 1600 may connect the display panel 100 to the bracket 400. Accordingly, the second conductive tape 1600 may have a relatively large thickness. In an embodiment, the thickness of the second conductive tape 1600 may be greater than the thickness of the first conductive tape 1500.

The display device 11 according to some exemplary embodiments may include the first conductive tape 1500_1 connecting the non-display area NDA of the display panel 100 to the metal layer 300 disposed on the second surface 102 of the display panel 100 and the second conductive tape 1600 connecting the non-display area NDA of the display panel 100 to the bracket 400 disposed under the display panel 100 so that the static electricity accumulated in the display panel 100 may escape to the metal layer 300 and the bracket 400 through the first conductive tape 1500_1 and the second conductive tape 1600, respectively. Therefore, damage to the display device 11 due to electrostatic discharge from the display panel 100 may further be prevented.

The second conductive tape 1600 may include a first portion 1610 connecting the first side area SA1 of the non-display area NDA of the display panel 100 to the bracket 400 and a second portion 1620 connecting the second side area SA2 of the non-display area NDA of the display panel 100 to the bracket 400. In an embodiment, the first portion 1610 and the second portion 1620 of the second conductive tape 1600 may respectively overlap the first side area SA1 and the second side area SA2 with the pad area PDA in between in a plan view, and the first portion 1510_1 and the second portion 1520_1 of the first conductive tape 1500_1 may respectively overlap the first side area SA1 and a portion of the metal layer 300 adjacent thereto and the second side area SA2 and another portion of the metal layer 300 adjacent thereto with the pad area PDA and each of the first portion 1610 and the second portion 1620 of the second conductive tape 1600 in between in a plan view.

When static electricity flows into the display panel 100, the static electricity may mainly accumulate at an edge or a corner of the display panel 100, and in some instances, the static electricity may accumulate at the first side area SA1 and the second side area SA2. Therefore, the first portion 1510_1 of the first conductive tape 1500_1 may connect the first side area SA1 to the metal layer 300, the second portion 1520_1 of the first conductive tape 1500 may connect the second side area SA2 to the metal layer 300, the first portion 1610 of the second conductive tape 1600 may connect the first side area SA1 to the bracket 400, and the second portion 1620 of the second conductive tape 1600 may connect the second side area SA2 to the bracket 400 so that the static electricity may efficiently escape to the metal layer 300 and the bracket 400 from the display panel 100.

Hereinafter, a display device according to an embodiment will be described with reference to FIGS. 13 to 17. Descriptions of elements of the display device described with reference to FIGS. 13 to 17, which are substantially the same as or similar to those of the display device described with reference to FIGS. 8 to 12, will not be repeated.

Figure 13:
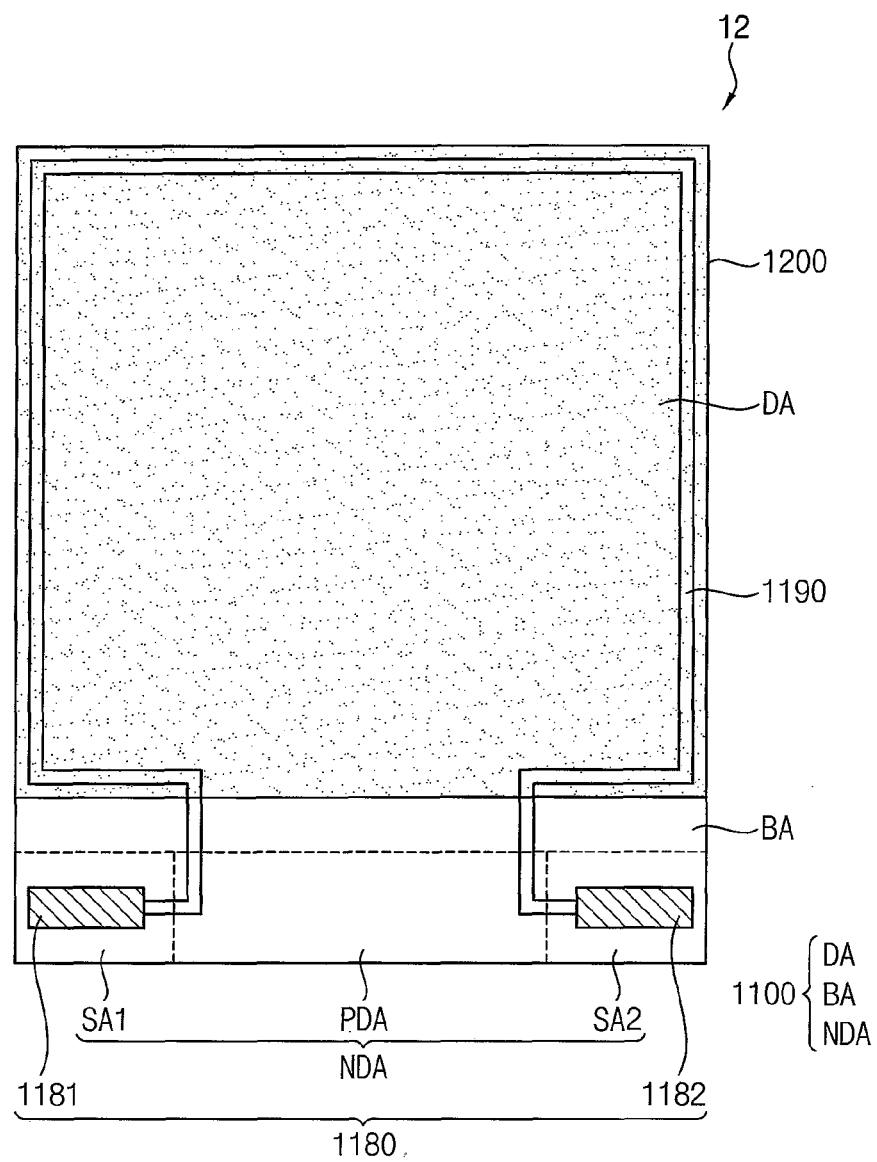
FIG. 13 is a front view illustrating a display device according to some exemplary embodiments.

FIG. 13 is a front view illustrating a display device according to some exemplary embodiments.

Referring to FIG. 13, a display device 12 according to an embodiment may include a display module DM_4 similar to the display module DM described in association with FIG. 2. The display module DM_4 may include a display panel 1100, a polarizing layer POL in FIG. 2, an impact absorbing layer IAL in FIG. 2, a window 1200, a protective layer PRL in FIG. 2, a cushion layer CUL in FIG. 2, and a metal layer 300 in FIG. 2.

The display panel 1100 may include a ground pad 1180 and a conductive line 1190. The ground pad 1180 may be disposed in the non-display area NDA, and the conductive line 1190 may be disposed in the display area DA. In an embodiment, the conductive line 1190 may be disposed adjacent to an edge of the display area DA. The conductive line 1190 may be electrically connected to the ground pad 1180.

In an embodiment, the ground pad 1180 may be disposed on (or in) the same layer as one of the gate line 132 in FIG. 3 and the data line 143 in FIG. 3, and the conductive line 1190 may be disposed on (or in) the same layer as one of the gate line 132 and the data line 143. When the ground pad 1180 and the conductive line 1190 are disposed on the same layer, the ground pad 1180 and the conductive line 1190 may be integrally formed. When the ground pad 1180 and the conductive line 1190 are disposed on different layers, the ground pad 1180 and the conductive line 1190 may be connected through a contact hole formed in the second insulation layer 112 in FIG. 3.

In an embodiment, the ground pad 1180 may include a first ground pad 1181 disposed in the first side area SA1 of the non-display area NDA and a second ground pad 1182 disposed in the second side area SA2 of the non-display area NDA. The first ground pad 1181 and the second ground pad 1182 may be spaced apart from each other with the pad area PDA in between in a plan view. In this case, an end of the conductive line 1190 may be connected to the first ground pad 1181, and another end of the conductive line 1190 may be connected to the second ground pad 1182.

Figure 14:
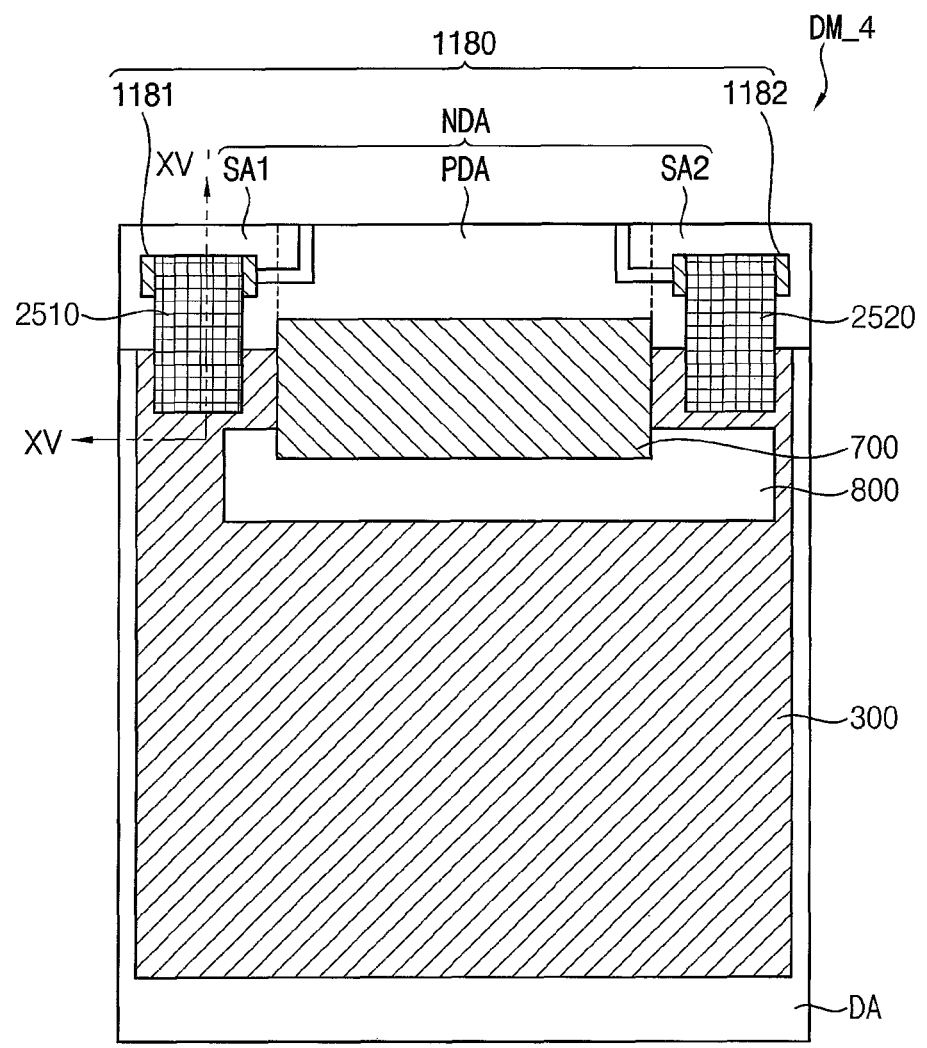
FIG. 14 is a rear view illustrating an example in which the display device in FIG. 13 is bent according to some exemplary embodiments.
Figure 15:
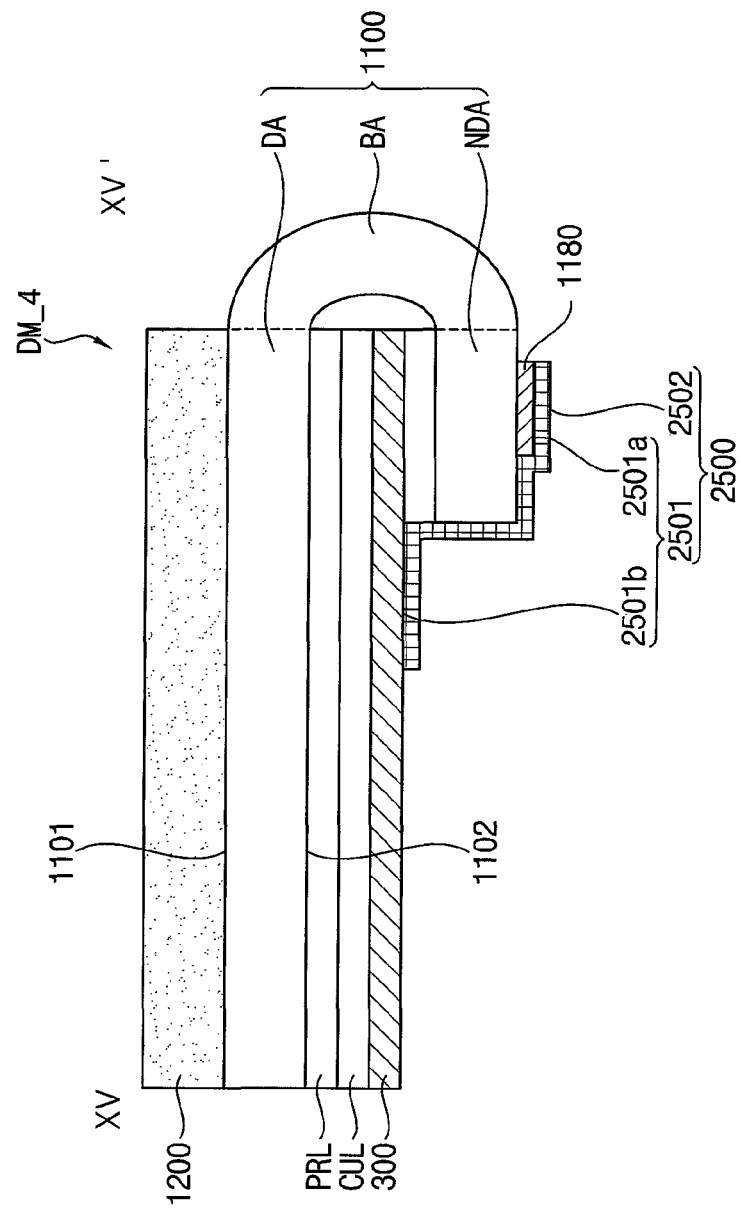
FIG. 15 is a cross-sectional view taken along sectional line XV-XV' in FIG. 14 according to some exemplary embodiments.

FIG. 14 is a rear view illustrating an example in which the display device in FIG. 13 is bent according to some exemplary embodiments. FIG. 15 is a cross-sectional view taken along sectional line XV-XV' in FIG. 14 according to some exemplary embodiments.

Referring to FIGS. 14 and 15, the bending area BA of the display panel 1100 may be bent along a bending axis extending in the second direction DR2. The bending area BA may be bent such that portions of the second surface 1102 of the display panel 1100 face to each other and the non-display area NDA overlaps the display area DA.

The display device 12 may include a first conductive tape 2500 connecting the ground pad 1180 of the display panel 1100 to the metal layer 300. The first conductive tape 2500 may be formed as a thin film, and may include metal, such as copper (Cu) or the like.

The first conductive tape 2500 may include a first surface 2501 and a second surface 2502 opposite to the first surface 2501. The first surface 2501 may be adhesive, and the second surface 2502 may not be adhesive. A first portion 2501a of the first surface 2501 may be attached to the ground pad 1180 of the display panel 1100, and a second portion 2501b of the first surface 2501 may be attached to the metal layer 300. The first surface 2501 of the first conductive tape 2500 may be attached to the ground pad 1180 of the display panel 1100 and the metal layer 300, and the first conductive tape 2500 may connect the display panel 1100 to the metal layer 300 so that the first conductive tape 2500 may have a relatively small thickness.

In a process of using the display device 12, friction may occur between the display device 12 and a user or an external object, and in some instances, when the display panel 1100 includes a substrate formed of an insulation material such as plastic, static electricity may flow into the display panel 1100 from the user or the external object. When electrostatic discharge (ESD) occurs in the display panel 1100 in which static electricity is accumulated, elements included in the display device 12 may be damaged. However, the display device 12 according to some exemplary embodiments may include the first conductive tape 2500 connecting the ground pad 1180 of the display panel 1100 to the metal layer 300 disposed on the second surface 1102 of the display panel 1100 so that the static electricity accumulated in the display panel 1100 may escape to the metal layer 300 through the first conductive tape 2500, and, therefore, damage to the display device 12 due to electrostatic discharge from the display panel 1100 may be prevented.

The first conductive tape 2500 may include a first portion 2510 connecting the first ground pad 1181 of the display panel 1100 to the metal layer 300 and a second portion 2520 connecting the second ground pad 1182 of the display panel 1100 to the metal layer 300. In an embodiment, the first portion 2510 and the second portion 2520 of the first conductive tape 2500 may respectively overlap the first ground pad 1181 and a portion of the metal layer 300 adjacent thereto and the second ground pad 1182 and another portion of the metal layer 300 adjacent thereto with the pad area PDA in between in a plan view.

When static electricity flows into the display panel 1100, the static electricity may mainly accumulate at an edge or a corner of the display panel 1100, and in some instances, the static electricity may accumulate at an edge of the display area DA of the display panel 1100. Therefore, the conductive line 1190 adjacent to the edge of the display area DA of the display panel 1100 may be electrically connected to the ground pad 1180, the first portion 2510 of the first conductive tape 2500 may connect the first ground pad 1181 to the metal layer 300, and the second portion 2520 of the first conductive tape 2500 may connect the second ground pad 1182 to the metal layer 300 so that the static electricity may efficiently escape to the metal layer 300 from the display panel 1100.

Figure 16:
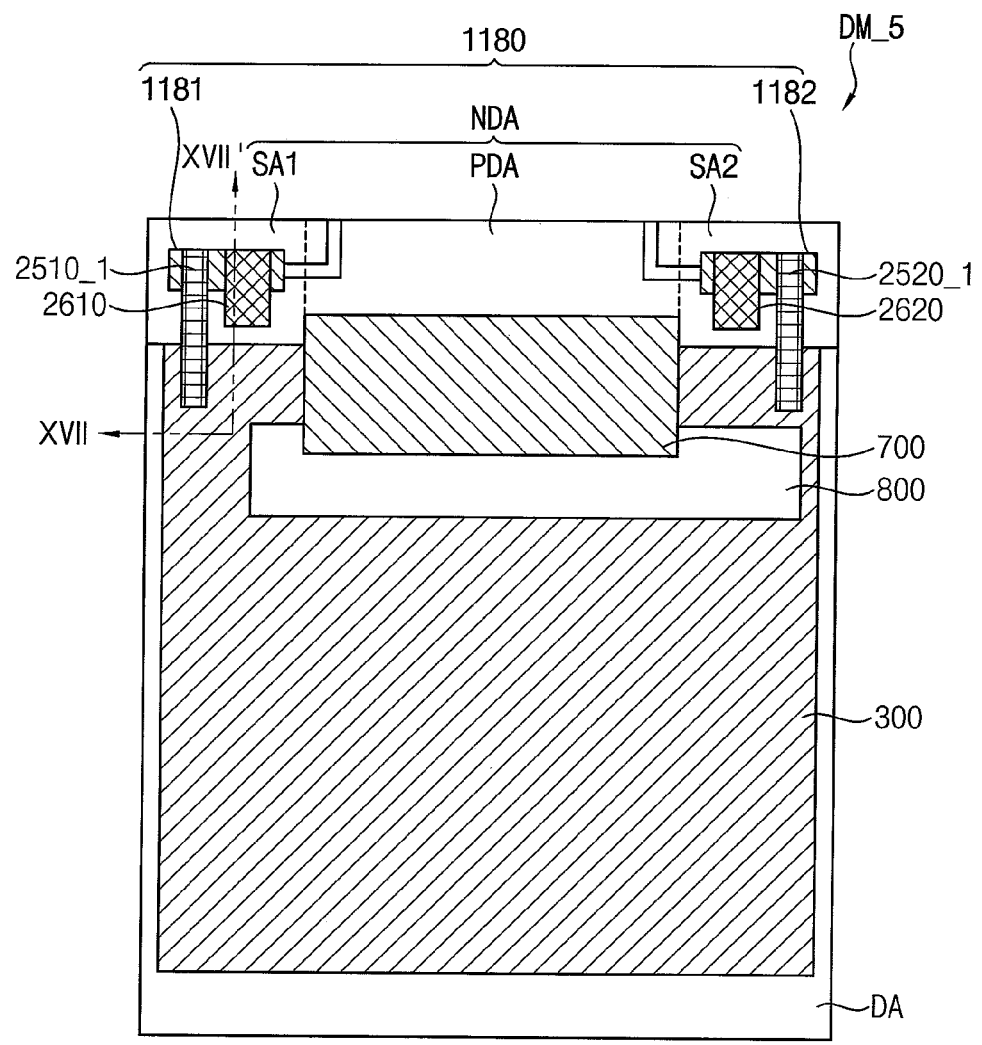
FIG. 16 is a rear view illustrating another example in which the display device in FIG. 13 is bent according to some exemplary embodiments.
Figure 17:
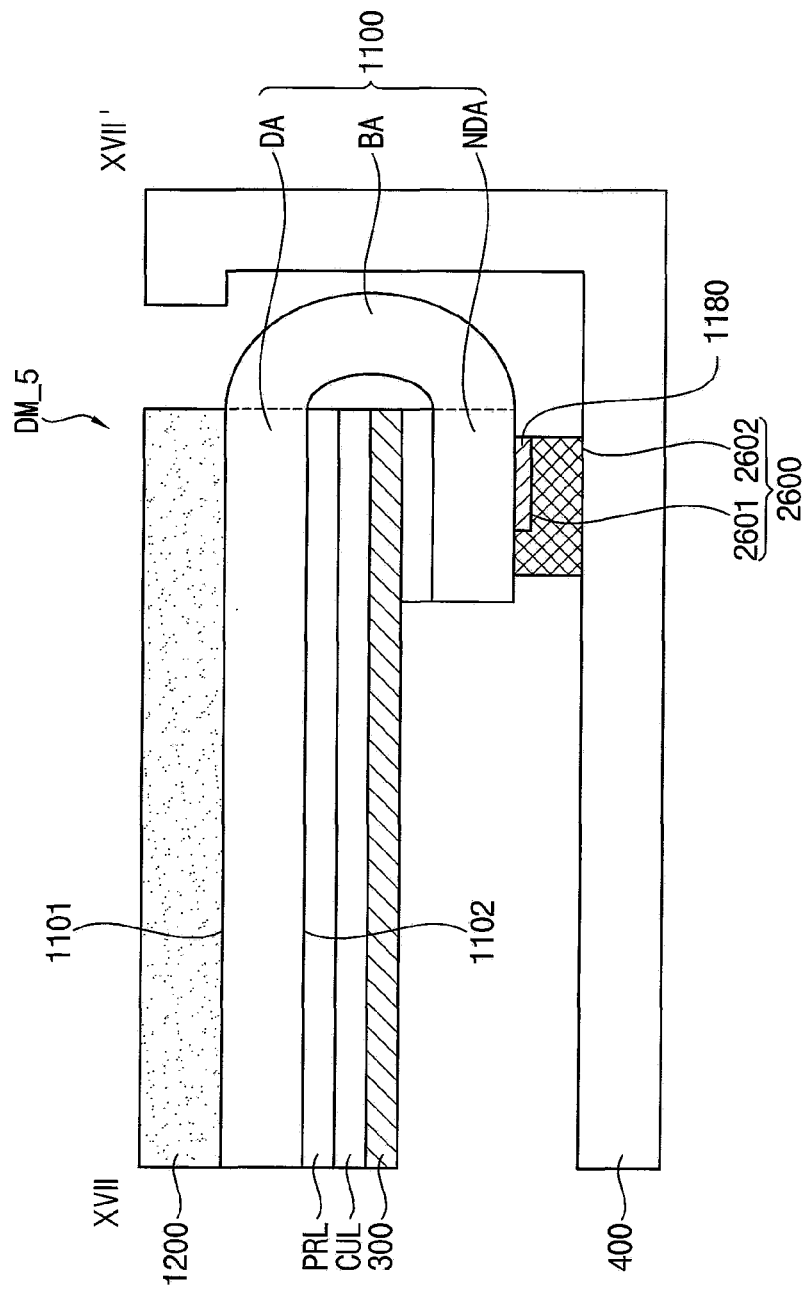
FIG. 17 is a cross-sectional view taken along sectional line XVII-XVII' in FIG. 16 according to some exemplary embodiments.

FIG. 16 is a rear view illustrating another example in which the display device in FIG. 13 is bent according to some exemplary embodiments. FIG. 17 is a cross-sectional view taken along sectional line XVII-XVII' in FIG. 16 according to some exemplary embodiments. Descriptions of elements of the display device 12 described with reference to FIGS. 16 and 17, which are substantially the same as or similar to those of the display device 12 described with reference to FIGS. 14 and 15, will not be repeated.

Referring to FIGS. 16 and 17, the display device 12 may include a bracket 400 disposed under the display panel 1100 of the display module DM_5. The lower surface of the bracket 400 may be spaced apart from the ground pad 1180 of the display panel 1100 in (or at) a predetermined distance. The bracket 400 may be electrically conductive.

The display device 12 may include a first conductive tape 2500_1 connecting the ground pad 1180 of the display panel 1100 to the metal layer 300 and a second conductive tape 2600 connecting the ground pad 1180 of the display panel 1100 to the bracket 400. The first conductive tape 2500_1 and the second conductive tape 2600 may be formed as a thin film, and may include metal, such as copper (Cu) or the like.

The second conductive tape 2600 may include a first surface 2601 and a second surface 2602 opposite to the first surface 2601. The first surface 2601 and the second surface 2602 may be adhesive. The first surface 2601 may be attached to the ground pad 1180 of the display panel 1100, and the second surface 2602 may be attached to the bracket 400. The first surface 2601 of the second conductive tape 2600 may be attached to the ground pad 1180 of the display panel 1100 and the second surface 2602 of the second conductive tape 2600 may be attached to the bracket 400 that is spaced apart from the ground pad 1180 of the display panel 1100 in the predetermined distance, so that the second conductive tape 2600 may connect the display panel 1100 to the bracket 400. Accordingly, the second conductive tape 2600 may have a relatively large thickness. In an embodiment, the thickness of the second conductive tape 2600 may be greater than the thickness of the first conductive tape 2500_1.

The display device 12 according to some exemplary embodiments may include the first conductive tape 2500_1 connecting the ground pad 1180 of the display panel 1100 to the metal layer 300 disposed on the second surface 1102 of the display panel 1100 and the second conductive tape 2600 connecting the ground pad 1180 of the display panel 1100 to the bracket 400 disposed under the display panel 1100 so that the static electricity accumulated in the display panel 1100 may escape to the metal layer 300 and the bracket 400 through the first conductive tape 2500_1 and the second conductive tape 2600, respectively. Therefore, damage to the display device 12 due to electrostatic discharge from the display panel 1100 may further be prevented.

The second conductive tape 2600 may include a first portion 2610 connecting the first ground pad 1181 of the display panel 1100 to the bracket 400 and a second portion 2620 connecting the second ground pad 1182 of the display panel 1100 to the bracket 400. In an embodiment, the first portion 2610 and the second portion 2620 of the second conductive tape 2600 may be respectively overlap the first ground pad 1181 and the second ground pad 1182 with the pad area PDA in between in a plan view, and the first portion 2510_1 and the second portion 2520_1 of the first conductive tape 2500_1 may respectively overlap the first ground pad 1181 and a portion of the metal layer 300 adjacent thereto and the second ground pad 1182 and another portion of the metal layer 300 adjacent thereto with the pad area PDA and each of the first portion 2610 and the second portion 2620 of the second conductive tape 2600 in between in a plan view.

When static electricity flows into the display panel 1100, the static electricity may mainly accumulate at an edge or a corner of the display panel 1100, and in some instances, the static electricity may accumulate at the edge of the display area DA of the display panel 1100. Therefore, the conductive line 1190 adjacent to the edge of the display area DA of the display panel 1100 may be electrically connected to the ground pad 1180, the first portion 2510_1 of the first conductive tape 2500 may connect the first ground pad 1181 to the metal layer 300, the second portion 2520_1 of the first conductive tape 2500_1 may connect the second ground pad 1182 to the metal layer 300, the first portion 2610 of the second conductive tape 2600 may connect the first ground pad 1181 to the bracket 400, and the second portion 2620 of the second conductive tape 2600 may connect the second ground pad 1182 to the bracket 400 so that the static electricity may efficiently escape to the metal layer 300 and the bracket 400 from the display panel 1100.

The display device according to various exemplary embodiments may be applied to a display device included in (or in association with) a computer, a notebook, a mobile phone, a smartphone, a smart pad, a personal media player (PMP), a personal digital assistant (PDA), an MP3 player, and/or the like.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device, comprising:
a display panel comprising a display area, a non-display area, and a bending area disposed between the display area and the non-display area and bent such that the non-display area overlaps the display area;
a window disposed on a first surface of the display panel and comprising a protruding portion overlapping the non-display area;
a metal layer disposed on a second surface of the display panel, the second surface being opposite to the first surface; and
a first conductive tape connecting the protruding portion of the window to the metal layer,
wherein:
the non-display area comprises a pad area to which a flexible circuit board is connected, and a first side area and a second side area respectively disposed at opposite sides of the pad area; and
the protruding portion comprises a first protruding portion and a second protruding portion respectively overlapping the first side area and the second side area of the non-display area.

2. The display device of claim 1, wherein:
a first surface of the first conductive tape is adhesive;
a first portion of the first surface of the first conductive tape is attached to the protruding portion of the window; and
a second portion of the first surface of the first conductive tape is attached to the metal layer.

3. The display device of claim 1, wherein the first conductive tape comprises a first portion connecting the first protruding portion to the metal layer and a second portion connecting the second protruding portion to the metal layer.

4. The display device of claim 1, wherein the window comprises plastic.

5. A display device of, comprising:
a display panel comprising a display area, a non-display area, and a bending area disposed between the display area and the non-display area and bent such that the non-display area overlaps the display area;
a window disposed on a first surface of the display panel and comprising a protruding portion overlapping the non-display area;
a metal layer disposed on a second surface of the display panel, the second surface being opposite to the first surface;
a first conductive tape connecting the protruding portion of the window to the metal layer;
a bracket disposed under the display panel; and
a second conductive tape connecting the protruding portion of the window to the bracket.

6. The display device of claim 5, wherein:
a first surface of the second conductive tape and a second surface of the second conductive tape opposite to the first surface are adhesive;
the first surface of the second conductive tape is attached to the protruding portion of the window; and the second surface of the second conductive tape is attached to the bracket.

7. The display device of claim 5, wherein:
the non-display area comprises a pad area to which a flexible circuit board is connected, and a first side area and a second side area respectively disposed at opposite sides of the pad area; and
the protruding portion comprises a first protruding portion and a second protruding portion respectively overlapping the first side area and the second side area of the non-display area.

8. The display device of claim 7, wherein the first conductive tape comprises a first portion connecting the first protruding portion to the metal layer and a second portion connecting the second protruding portion to the metal layer.

9. The display device of claim 7, wherein the second conductive tape comprises a first portion connecting the first protruding portion to the bracket and a second portion connecting the second protruding portion to the bracket.

10. The display device of claim 5, wherein a thickness of the second conductive tape is greater than a thickness of the first conductive tape.

11. A display device, comprising:
a display panel comprising a display area, a non-display area, and a bending area disposed between the display area and the non-display area and bent such that the non-display area overlaps the display area;
a window disposed on a first surface of the display panel;
a metal layer disposed on a second surface of the display panel, the second surface being opposite to the first surface; and
a first conductive tape connecting the non-display area of the display panel to the metal layer,
wherein the non-display area comprises a pad area to which a flexible circuit board is connected, and a first side area and a second side area respectively disposed at opposite sides of the pad area, and
wherein the first conductive tape comprises a first portion connecting the first side area to the metal layer and a second portion connecting the second side area to the metal layer.

12. The display device of claim 11, wherein:
a first surface of the first conductive tape is adhesive;
a first portion of the first surface of the first conductive tape is attached to the non-display area of the display panel; and
a second portion of the first surface of the first conductive tape is attached to the metal layer.

13. The display device of claim 11, wherein:
the display panel comprises a ground pad disposed in the non-display area and a conductive line disposed in the display area and electrically connected to the ground pad; and
the first conductive tape connects the ground pad to the metal layer.

14. The display device of claim 11, further comprising:
a bracket disposed under the display panel; and
a second conductive tape connecting the non-display area of the display panel to the bracket.

15. The display device of claim 14, wherein:
a first surface of the second conductive tape and a second surface of the second conductive tape opposite to the first surface are adhesive;
the first surface of the second conductive tape is attached to the non-display area of the display panel; and
the second surface of the second conductive tape is attached to the bracket.

16. The display device of claim 14, wherein the non-display area comprises a pad area to which a flexible circuit board is connected, and a first side area and a second side area respectively disposed at opposite sides of the pad area.

17. The display device of claim 16, wherein the first conductive tape comprises a first portion connecting the first side area to the metal layer and a second portion connecting the second side area to the metal layer.

18. The display device of claim 16, wherein the second conductive tape comprises a first portion connecting the first side area to the bracket and a second portion connecting the second side area to the bracket.

19. The display device of claim 14, wherein a thickness of the second conductive tape is greater than a thickness of the first conductive tape.

20. The display device of claim 14, wherein:
the display panel comprises a ground pad disposed in the non-display area and a conductive line disposed in the display area and electrically connected to the ground pad; and
the second conductive tape connects the ground pad to the bracket.

* * * * *